(12) United States Patent
Yach et al.

(10) Patent No.: US 8,988,142 B2
(45) Date of Patent: Mar. 24, 2015

(54) INTEGRATED HIGH VOLTAGE ISOLATION USING LOW VALUE CAPACITORS

(71) Applicant: Microchip Technology Incorporated, Chandler, AZ (US)

(72) Inventors: Randy Yach, Phoeniz, AZ (US); Gregory Dix, Tempe, AZ (US); Thomas Youbok Lee, Chandler, AZ (US); Vincent Quiquempoix, Divonne les bains (FR)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 14/198,078

(22) Filed: Mar. 5, 2014

(65) Prior Publication Data

US 2014/0253227 A1 Sep. 11, 2014

Related U.S. Application Data

(60) Provisional application No. 61/775,663, filed on Mar. 10, 2013.

(51) Int. Cl.
*G05F 1/10* (2006.01)
*G05F 3/08* (2006.01)
(Continued)

(52) U.S. Cl.
CPC .............. *G05F 3/08* (2013.01); *H01L 25/0655* (2013.01); *H01L 25/16* (2013.01); *H01L 25/162* (2013.01); *H04L 25/0266* (2013.01); *H04L 25/4902* (2013.01); *H01L 28/40* (2013.01); *H01L 2224/48091* (2013.01);
(Continued)

(58) Field of Classification Search
CPC ................................ H02M 3/22; H02M 3/337
USPC .................. 327/535, 536, 538, 540, 564, 565
See application file for complete search history.

(56) References Cited

U.S. PATENT DOCUMENTS 6,442,213 B1   8/2002   Krone et al. ................... 375/285
6,611,051 B2 *  8/2003   Akiyama et al. .............. 257/685
(Continued)

FOREIGN PATENT DOCUMENTS

WO          98/44560 A1    10/1998   ............. H01L 27/04
WO      2012/068198 A1     5/2012   ............. H01L 23/482

OTHER PUBLICATIONS

International Search Report and Written Opinion, Application No. PCT/US2014/021614, 10 pages, Jun. 25, 2014.
(Continued)

*Primary Examiner* — Jeffrey Zweizig
(74) *Attorney, Agent, or Firm* — King & Spalding L.L.P.

(57) ABSTRACT

High voltage rated isolation capacitors are formed on a face of a primary integrated circuit die. The isolation capacitors AC couple the primary integrated circuit in a first voltage domain to a second integrated circuit in a second voltage domain. The isolation capacitors DC isolate the primary integrated circuit from the second integrated circuit die. Isolated power transfer from the first voltage domain to the second voltage domain is provided through the high voltage rated isolation capacitors with an AC oscillator or PWM generator. The AC oscillator voltage amplitude may be increased for an increase in power through the high voltage rated isolation capacitors, and a larger value capacitor in the second voltage domain may provide for peak current demand from circuits in the second voltage domain.

20 Claims, 9 Drawing Sheets

(51) Int. Cl.
*H01L 25/065* (2006.01)
*H01L 25/16* (2006.01)
*H04L 25/02* (2006.01)
*H04L 25/49* (2006.01)
*H01L 49/02* (2006.01)

(52) U.S. Cl.
CPC ............... *H01L 2224/48137* (2013.01); *H01L 2224/49175* (2013.01); *H01L 2224/48195* (2013.01); *H01L 2224/48265* (2013.01); *H01L 2924/00014* (2013.01); *H01L 2924/19104* (2013.01)
USPC .......................................................... 327/540

(56) References Cited

U.S. PATENT DOCUMENTS

| | | | |
|---|---|---|---|
| 7,737,871 B2* | 6/2010 | Leung et al. | 341/100 |
| 7,864,546 B2* | 1/2011 | Dhuyvetter et al. | 363/17 |
| 8,564,978 B2* | 10/2013 | Keller | 363/21.07 |
| 2006/0290377 A1 | 12/2006 | Kim et al. | 326/30 |
| 2009/0206960 A1 | 8/2009 | Ng et al. | 333/247 |
| 2012/0068306 A1 | 3/2012 | Song et al. | 257/532 |

OTHER PUBLICATIONS

International Search Report and Written Opinion, Application No. PCT/US2014/022640, 14 pages, Jul. 28, 2014.

* cited by examiner

INTEGRATED HIGH VOLTAGE ISOLATION USING LOW VALUE CAPACITORS

RELATED PATENT APPLICATION

This application claims priority to commonly owned U.S. Provisional patent application Ser. No. 61/775,663; filed Mar. 10, 2013; which is hereby incorporated by reference herein for all purposes.

TECHNICAL FIELD

The present disclosure relates to high voltage isolation capacitors, in particular to integrated high voltage isolation using low value capacitors in an integrated circuit.

BACKGROUND

In recent industrial applications, the need for electrical isolation, both Galvanic and direct current (DC)-to-DC, is increasing for both data communication and DC supply voltages, e.g., at differing ground potentials. The typical isolation application has been mainly for data communications across an isolation barrier. But in recent years, applications are demanding that the isolation device (for data communication) also include isolated DC-to-DC energy transfer capabilities as well.

Typical electrical isolation methods may include: optical, inductive, e.g., using alternating current (AC) through a transformer or electromagnetic radio frequencies, capacitor (capacitor is a very good galvanic isolator), etc. Optical couplers have been the dominant signal isolation device but are limited to slow data rates (less than 1 MHz) and are bulky to integrate. Moreover, the optical coupler is not capable of passing isolated DC power. Inductive and capacitive isolation implementations provide for high data rates, offer electrically isolated power transfer, and are low-cost to manufacture. However integrating effective high voltage isolation capacitors in an integrated circuit package has been problematic.

SUMMARY

Therefore, a need exists for a way to use high voltage, low capacitance value isolation capacitors to transfer power between two integrated circuits in different voltage domains.

According to an embodiment, an integrated circuit device adapted for high voltage isolation between different voltage domains may comprise: a primary integrated circuit coupled to a first voltage domain; a secondary integrated circuit coupled to a second voltage domain; a first insulating layer over at least a portion of a face of the primary integrated circuit; a plurality of high voltage rated isolation capacitors positioned over the first insulating layer, wherein each of the plurality of high voltage rated isolation capacitors comprises a first electrically conductive layer on the first insulating layer, a high voltage rated dielectric layer on a portion of a respective first electrically conductive layers, and a second electrically conductive layer on the respective high voltage rated dielectric layer; a waveform generator provided in the primary integrated circuit; push-pull drivers provided in the primary integrated circuit, having inputs coupled to the waveform generator and outputs coupled to respective ones of the first electrically conductive layers; and an alternating current (AC)-to-direct current (DC) converter provided in the secondary integrated circuit and having inputs coupled to respective ones of the second electrically conductive layers, whereby AC power is transferred from the push-pull drivers to the AC-to-DC converter.

According to a further embodiment, a second insulating layer may be provided over at least a portion of the second electrically conductive layers, over portions of the high voltage rated dielectric layers and the first electrically conductive layers, wherein the second insulating layer has first openings over the first electrically conductive layers for first bond wires to couple the first electrically conductive layers to circuit connection pads on the primary integrated circuit, and second openings over the second electrically conductive layers for second bond wires to couple the second electrically conductive layers to circuit connection pads on the secondary integrated circuit.

According to a further embodiment, an integrated circuit package may be provided for encapsulating the primary and secondary integrated circuits and the high voltage rated isolation capacitors. According to a further embodiment, the integrated circuit package has some external connection nodes coupled to respective first electrically conductive layers and some other external connection nodes coupled to respective second electrically conductive layers of the plurality of first high voltage rated isolation capacitors. According to a further embodiment, the external connection nodes are lead fingers of the integrated circuit package lead frame and the respective lead fingers are coupled to the first and second electrically conductive layers with bond wires. According to a further embodiment, the first and second electrically conductive layers are metal. According to a further embodiment, the first and second electrically conductive metal layers are comprised of aluminum. According to a further embodiment, the first and second electrically conductive layers are comprised of copper. According to a further embodiment, the first and second electrically conductive layers are selected from any one or more of the group consisting of titanium, tantalum, cobalt, molybdenum, and silicides and salicides thereof.

According to a further embodiment, the high voltage rated dielectric layers comprise silicon dioxide ($SiO_2$). According to a further embodiment, the high voltage rated dielectric layer comprises silicon nitride (SiN). According to a further embodiment, the high voltage rated dielectric layer comprises Oxynitride. According to a further embodiment, the high voltage rated dielectric layer comprises stacked layers of doped or undoped oxides of different thicknesses and deposited or grown by standard techniques. According to a further embodiment, the high voltage rated dielectric layers each have a thickness of about four (4) microns ($\mu$). According to a further embodiment, the high voltage rated isolation capacitors each have a capacitance value of about 10 picofarads. According to a further embodiment, the primary integrated circuit is a microcontroller. According to a further embodiment, each of the outputs of the push-pull drivers is coupled to at least two of the first electrically conductive layers, and corresponding at least two second electrically conductive layers are coupled to the AC-to-DC converter.

According to a further embodiment, a low voltage capacitor may be coupled to an output of the AC-to-DC converter, wherein the low voltage capacitor may have a capacitance value greater than a one of the plurality of high voltage rated isolation capacitors. According to a further embodiment, a voltage regulator may be coupled to an output of the AC-to-DC converter. According to a further embodiment, the voltage regulator has a voltage feedback control output coupled to a one of the second electrically conductive layers of the plurality of high voltage rated isolation capacitors, and a respective one of the first electrically conductive layers of the plurality of high voltage rated isolation capacitors coupled to a control input of the waveform generator, wherein the voltage feedback control output of the voltage regulator controls an output of the waveform generator.

According to a further embodiment, the waveform generator is an oscillator and the voltage regulator controls the output amplitude thereof. According to a further embodiment, the waveform generator is an oscillator and the voltage regulator controls the output frequency thereof. According to a further embodiment, a PWM modulator may be coupled between the voltage feedback control output of the voltage regulator and the one of the second electrically conductive layers of the plurality of high voltage rated isolation capacitors, and the waveform generator comprises power switches controlled by the PWM modulator. According to a further embodiment, the waveform generator is an oscillator. According to a further embodiment, a voltage multiplier may be coupled between a voltage source in the first voltage domain and supplying a multiplied operating voltage to the push-pull drivers. According to a further embodiment, the voltage multiplier may multiply the voltage source by two. According to a further embodiment, the voltage multiplier multiplies the voltage source by three. According to a further embodiment, the AC-to-DC converter is a charge pump. According to a further embodiment, the AC-to-DC converter is a rectifier.

BRIEF DESCRIPTION OF THE DRAWINGS

A more complete understanding of the present disclosure may be acquired by referring to the following description taken in conjunction with the accompanying drawings wherein.

Figure 1:
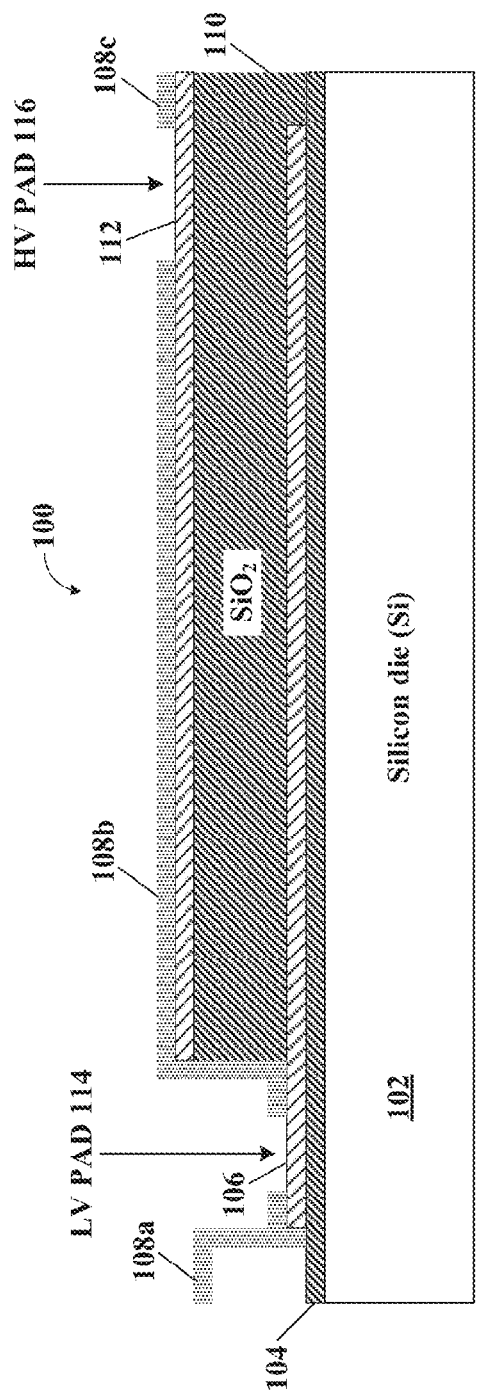
FIGS. 1 and 1A illustrate schematic elevational view diagrams of a high voltage rated isolation capacitor formed on an integrated circuit, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments, an isolated supply voltage may be generated, which is electrically isolated from the primary supply source. Such a feature can become very demanding for modern electronic system design. DC-to-DC isolation and AC-to-AC isolation are the examples thereof. A capacitive isolation device may use (a) a method of transferring power from the primary to the secondary side across a capacitive isolation barrier; and (b) a method of regulating the isolated secondary power using a feedback network. For such an application a high voltage rating (>3,000 Vrms) silicon capacitors are needed to create an electrical, e.g., Galvanic, isolation barrier between different communication devices. This high voltage rating capacitor may be used for (a) isolated DC-to-DC power transfer and (b) isolated data communication between devices connected to different voltage domains.

High voltage capacitor sizes are limited because of the breakdown voltage of standard semiconductor insulators. A capacitor according to various embodiments will attempt to use a smaller value capacitor to pass power to the secondary die. A larger value capacitor with a smaller breakdown voltage may then be used as a holding/filter capacitor after a charge pump or rectifier in a secondary IC connected to a second voltage domain. To pass power to the secondary IC through a small capacitor will require a larger voltage swing and/or a higher frequency.

According to various embodiments, a capacitive couplings for an isolation device may be fabricated that may provide for an about 3,000 Vrms high-voltage rated capacitor. According to various embodiments, a method of creating low-cost high voltage rating capacitor is proposed that is formed with a special electrode geometry with a $SiO_2$ dielectric insulator.

According to various embodiments, a DC-to-DC energy transfer may include: Converting DC energy ($V_{DD1}$) to variable oscillation frequency, or an adjustable PWM (from external or internal); Transferring AC energy across the isolation barrier using a capacitive media; create the secondary supply voltage ($V_{DD2}$) using rectifier+regulator; and remote monitoring of the regulated voltage of the secondary device. Oscillator output frequency (or PWM) may be auto-tuned based on the feedback signal from the secondary device (regulated voltage output level indicator).

According to various embodiments, for example, scrap integrated circuit wafers may be used with simple processing to make the isolation capacitors described herein based on silicon dioxide ($SiO_2$) and aluminum that are suitable to use in a stacked die package. The electrically insulating oxide thickness may be selected to withstand several thousand volts and the resulting capacitance high enough to enable efficient power and signal transfer between integrated circuit devices connected to two different voltage domains.

Using stacked die $SiO_2$ insulated capacitors was thought to yield too low of a value of capacitance. However, according to various embodiments of this disclosure, by using various circuit techniques, e.g., higher voltage transistors, voltage doublers and triplers, etc., for providing a higher voltage across these capacitors, they may be fabricated with sufficient capacitance for efficient power and signal transfer.

To generate an isolation supply voltage using the primary DC energy over a galvanic isolation barrier, the secondary supply voltage (over the isolation barrier) may be generated by using the primary supply voltage via capacitive or inductive energy coupling method.

According to an embodiment, the secondary supply has sufficient power (P=V*I) to provide the load current in the second voltage domain. The regulated isolated voltage may be designed to meet the maximum load current of devices connected thereto.

According to an embodiment, special electrode geometry for high-voltage rating SiO2 capacitor is proposed, that can provide isolation voltage greater than 3,000 Vrms.

Further it will be disclosed how to inter-connect the isolation capacitors with other devices in a single integrated circuit package.

Finally, the high voltage capacitor may be used for the following applications and is not limited to the specific applications discussed in the various embodiments disclosed herein:

DC energy transfer from a primary device to a secondary device, and

Data communications from a primary device to a secondary device, or vise versa.

Referring now to the drawings, the details of example embodiments are schematically illustrated. Like elements in the drawings will be represented by like numbers, and similar elements will be represented by like numbers with a different lower case letter suffix.

Figure 1A:
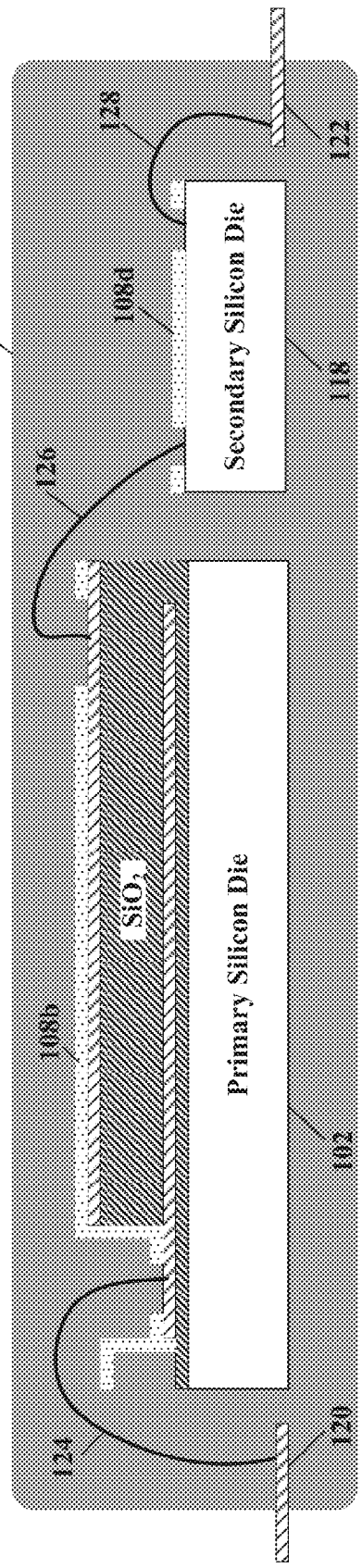

Referring to FIGS. 1 and 1A, depicted are schematic elevational view diagrams of a high voltage rated isolation capacitor formed on an integrated circuit, according to a specific example embodiment of this disclosure. A high voltage rated isolation capacitor, generally represented by the numeral 100, may comprise a first conductive layer 106, a second conductive layer 112, a high voltage rated dielectric (insulating) layer 110 between the first and second conductive layers 106 and 112, respectively, and an insulating layer 108, e.g., passivation, over the second conductive layer 112 and a portion of the first conductive layer 106. A first pad opening 114 may be used to provide electrical access to the first conductive layer 106. A second pad opening 116 may be used to provide electrical access to the second conductive layer 112. The high voltage rated isolation capacitor 100 may be positioned over and attached to an insulating layer 104 deposed on an integrated circuit 102.

At least one high voltage rated isolation capacitor 100 may be fabricated using a first mask to form the first conductive layer 106, and a second mask to form the second conductive layer 112 and the high voltage rated dielectric layer 110. A third mask may be used to form first and second pad openings 114 and 116, respectively, in the insulating (e.g., passivation) layer 108. It is contemplated and within the scope of this disclosure that other process fabrications steps may be used with equal success, and one having ordinary skill in the art of integrated circuit fabrication and the benefit of this disclosure could come up with such alternate designs and still be within the spirit and intent of this disclosure.

The first and second conductive layers 106 and 112, respectively, may comprise a conductive metallic material such as, for example but is not limited to, aluminum, copper, titanium, tantalum, cobalt, molybdenum, silicides and salicides thereof, etc. The insulating layer 104 may be, for example but is not limited to, silicon dioxide ($SiO_2$), silicon nitride (SiN), Oxynitride, or stacked layers of doped or undoped oxides of different thicknesses and deposited or grown by standard techniques, etc. The high voltage rated dielectric layer 110 may be, for example but is not limited to, silicon dioxide ($SiO_2$), silicon nitride (SiN), $SiO_xN_y$, oxide-nitride-oxide (ONO), etc. The thickness of the insulating dielectric layer 110 may determine the voltage withstand capabilities of the high voltage rated isolation capacitor 100, and may be, for example but is not limited to, about four (4) microns thick $SiO_2$ for about a 3,000 volt DC insulation breakdown voltage. The insulating layer 108 may be a protective passivation layer, e.g., silicon dioxide, silicon nitride, etc., having openings for connection to the low voltage pad 114 and the high voltage pad 116. The terms "high voltage pad" and "low voltage pad" refer to different voltage domains that have no direct current (DC) connections for either power, ground or signals. The voltage differences may be large or small between voltage domains, and further may be used for protection from and isolation of devices subject to large voltage transients, e.g., sensors subject to induced electromotive force (EMF) volts that may be caused by lightning, power switching transients, etc.

Referring now to FIG. 1A, the first conductive layer 106 of the high voltage rated isolation capacitor 100 assembly may be connected to lead fingers 120 and/or connection pads on the integrated circuit 102, hereinafter "primary IC 102," with bond wires 124. The conductive layer 112 of the high voltage rated isolation capacitor 100 assembly may be connected to connection pads on a second integrated circuit 118, hereinafter "secondary IC 118," and/or lead fingers 122 with bond wires 126. The secondary IC 118 may be connected to the lead fingers 122 with bond wires 128. The primary IC 102 may be configured to operate in a first voltage domain, and the secondary IC 118 may be configured to operate in a second voltage domain. The ground and voltage potentials between the first and second voltage domains may be thousands of volts different, only limited by the voltage withstand (breakdown) of the high voltage rated dielectric layer 110, e.g., thickness thereof. The lead fingers 120 may be coupled to the first voltage domain, and the lead fingers 122 may be coupled to the second voltage domain. The primary IC 102, the high voltage rated isolation capacitor 100, secondary IC 118, and portions of the lead fingers 120 and 122 may be encapsulated in an integrated circuit package 130, e.g., epoxy. Die paddles, if used, are not shown for illustrative clarity. It is contemplated and within the scope of this disclosure that other integrated circuit external connection nodes besides lead fingers may be used, e.g., ball bumps, etc.

Figure 1B:
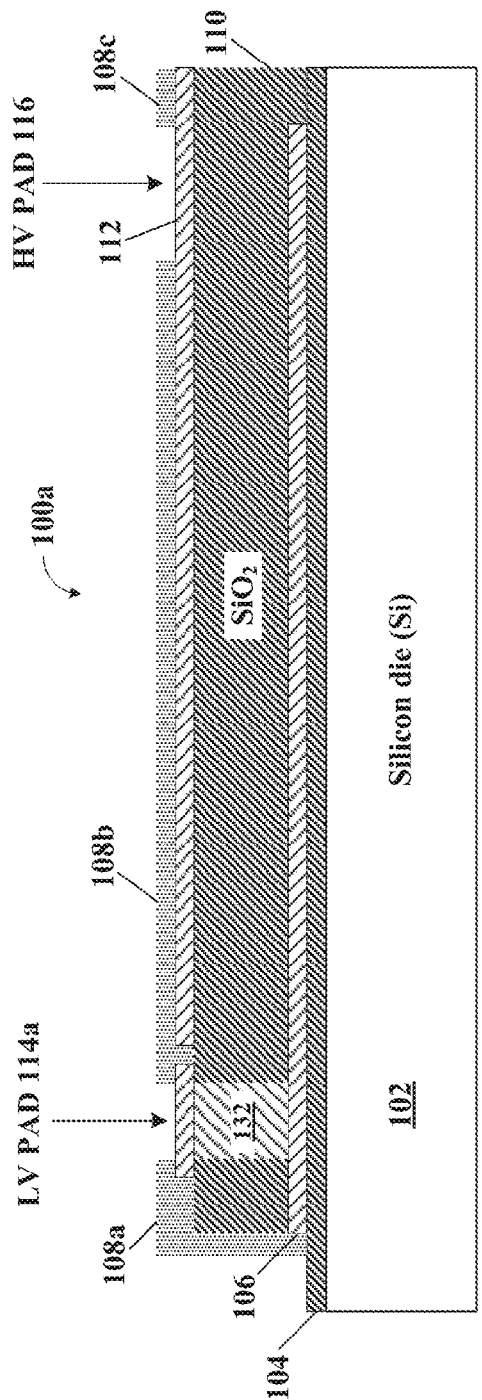
FIGS. 1B and 1C illustrate schematic elevational view diagrams of a high voltage rated isolation capacitor formed on an integrated circuit, according to another specific example embodiment of this disclosure.
Figure 1C:
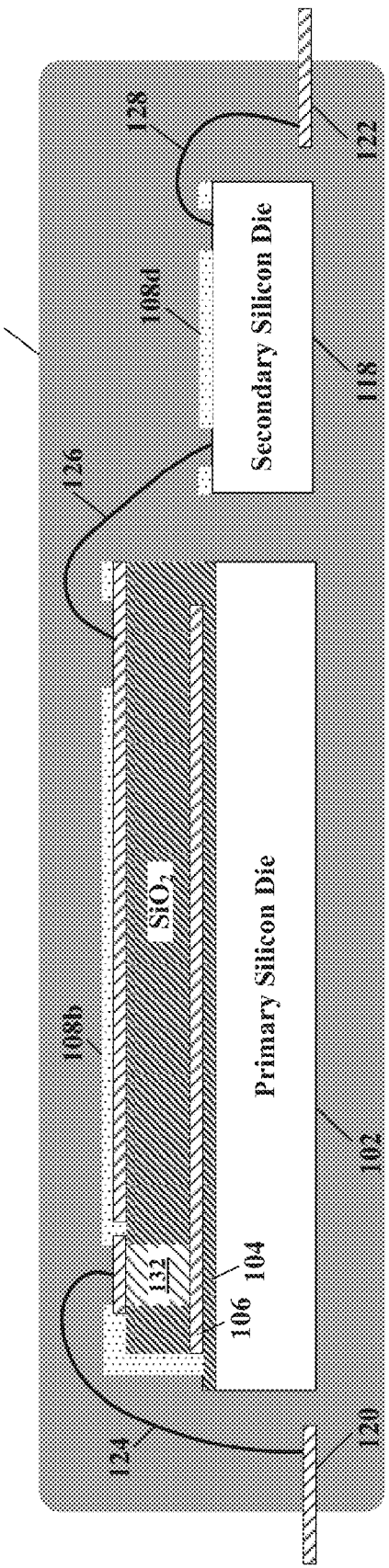

Referring to FIGS. 1B and 1C, depicted are schematic elevational view diagrams of a high voltage rated isolation capacitor formed on an integrated circuit, according to another specific example embodiment of this disclosure. A high voltage rated isolation capacitor, generally represented by the numeral 100a, may comprise a first conductive layer 106, a second conductive layer 112, a high voltage rated dielectric (insulating) layer 110 between the first and second conductive layers 106 and 112, respectively, and an insulating layer 108, e.g., passivation, over the second conductive layer 112 and a portion of the first conductive layer 106. Conductive material 132 may be used to fill in an opening in the high voltage rated dielectric layer 110 that may be over the first conductive layer 106. The conductive material 132 may be used to provide electrical access to the first conductive layer 106. A second pad opening 116 may be used to provide electrical access to the second conductive layer 112. The high voltage rated isolation capacitor 100a may be positioned over and attached to an insulating layer 104 deposed on an integrated circuit 102. Operation of the high voltage rated isolation capacitor 100a is substantially the same as operation of the high voltage rated isolation capacitor 100 described hereinabove.

Figure 2:
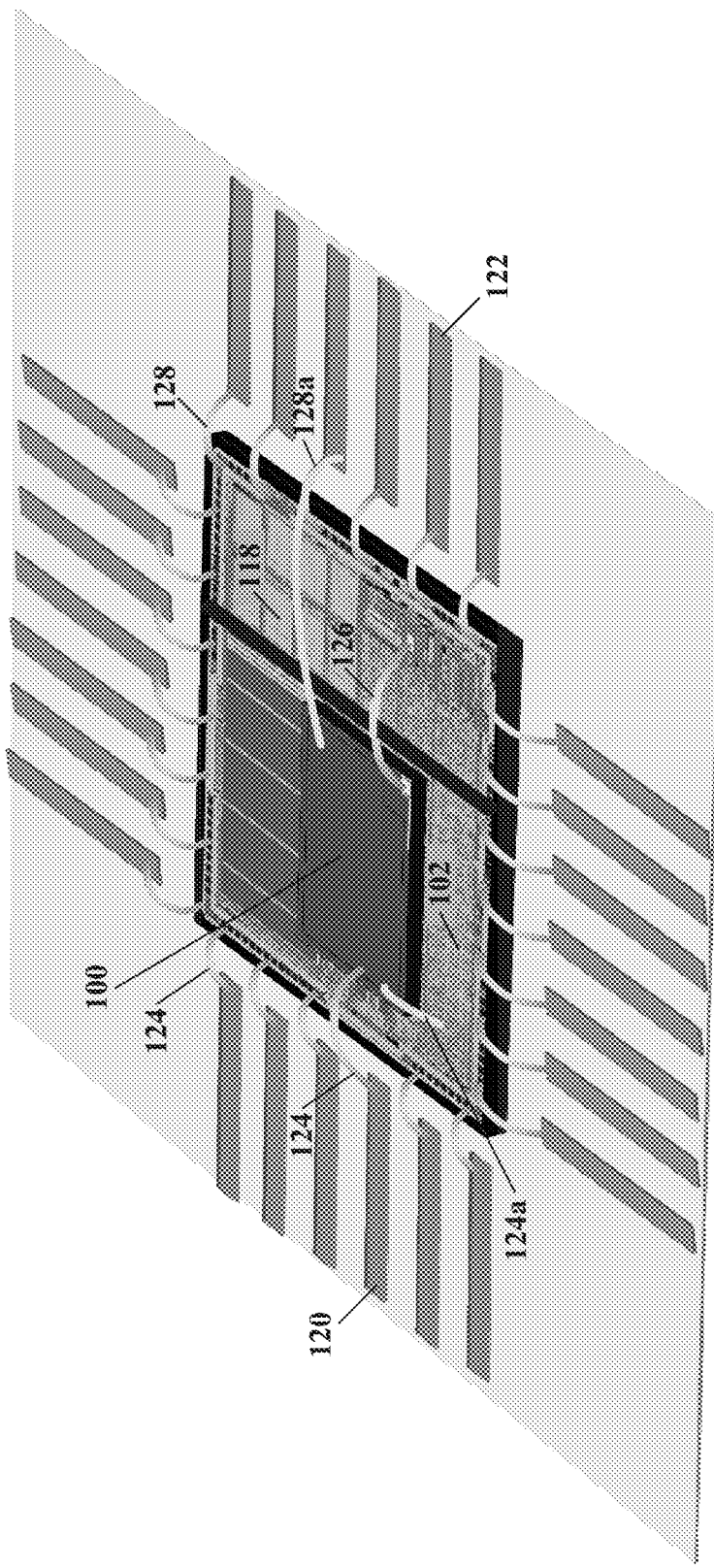
FIG. 2 illustrates a schematic orthogonal view diagram of a high voltage rated isolation capacitor formed on an integrated circuit, according to specific example embodiments of this disclosure.

Referring to FIG. 2, depicted is a schematic orthogonal view diagram of a high voltage rated isolation capacitor formed on an integrated circuit, according to specific example embodiments of this disclosure. The high voltage rated isolation capacitor 100 is shown attached to the primary IC 102 and connected to some of the lead fingers 120 with bond wires 124, the primary IC 102 with bond wires 124a, the secondary IC 118 with bond wires 126, and/or the lead fingers 122 with bond wires 126a. The high voltage rated isolation capacitor 100 may be attached to an insulating layer 104, e.g., passivation layer, on a face of the primary IC 102.

Figure 3:
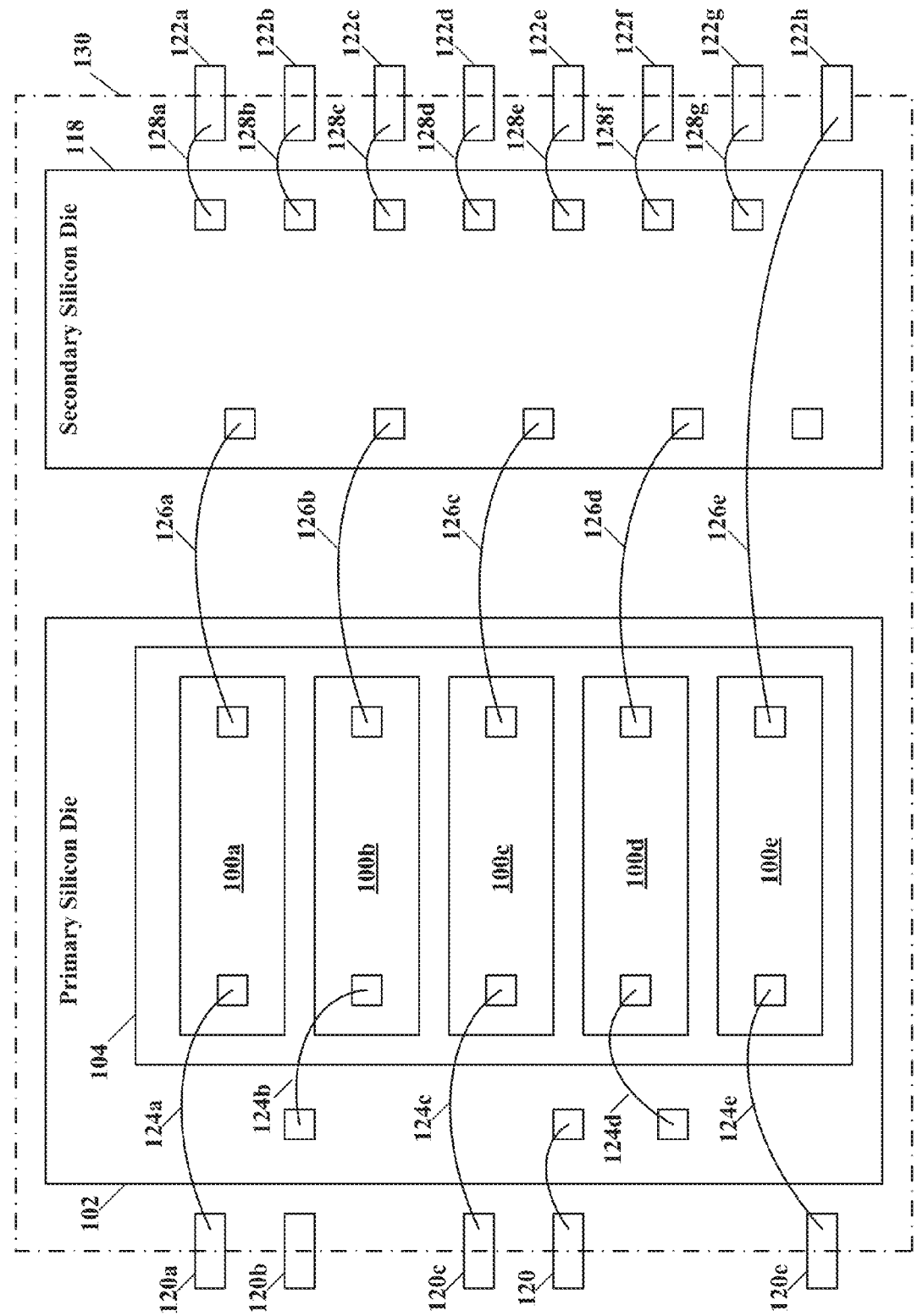
FIG. 3 illustrates a schematic plan view diagram of a plurality of high voltage rated isolation capacitors formed on a primary integrated circuit and coupled to a secondary integrated circuit, according to specific example embodiments of this disclosure.

Referring to FIG. 3, depicted is a schematic plan view diagram of a plurality of high voltage rated isolation capacitors formed on a primary integrated circuit and coupled to a secondary integrated circuit, according to specific example embodiments of this disclosure. A plurality of high voltage rated isolation capacitors 100 may be deposed over the primary IC 102 on an insulating layer 104 (FIGS. 1 and 1A). Each of the plurality of high voltage rated isolation capacitors 100 may be used to direct current (DC) isolate a lead finger 120 in a first voltage domain from a signal or power pad of the secondary IC 118 in a second voltage domain (e.g., lead finger 120a, bond wire 124a, isolation capacitor 100a, bond wire 126a and connection pad of secondary IC 118). From a signal pad of the primary IC 102 to a signal pad of the secondary IC 118 (e.g., bond wire 124b, isolation capacitor 100b, bond wire 126b, and connection pad of secondary IC 118). From a lead finger 120e in the first voltage domain to a lead finger 122h in the second voltage (e.g., bond wire 124e, isolation capacitor 100e, bond wire 126e and lead finger 122h).

A plurality of high voltage rated isolation capacitors 100 may be connected as necessary for a particular application. Each of the high voltage rated isolation capacitors 100 may be formed as shown in FIGS. 1 and 1A and described hereinabove. It is contemplated and with the scope of this disclosure that the high voltage rated isolation capacitors 100 may be formed in any geometric shape desired and they are not limited to square or rectangular shapes as shown in the specific example embodiment shown in FIG. 3.

Figure 4:
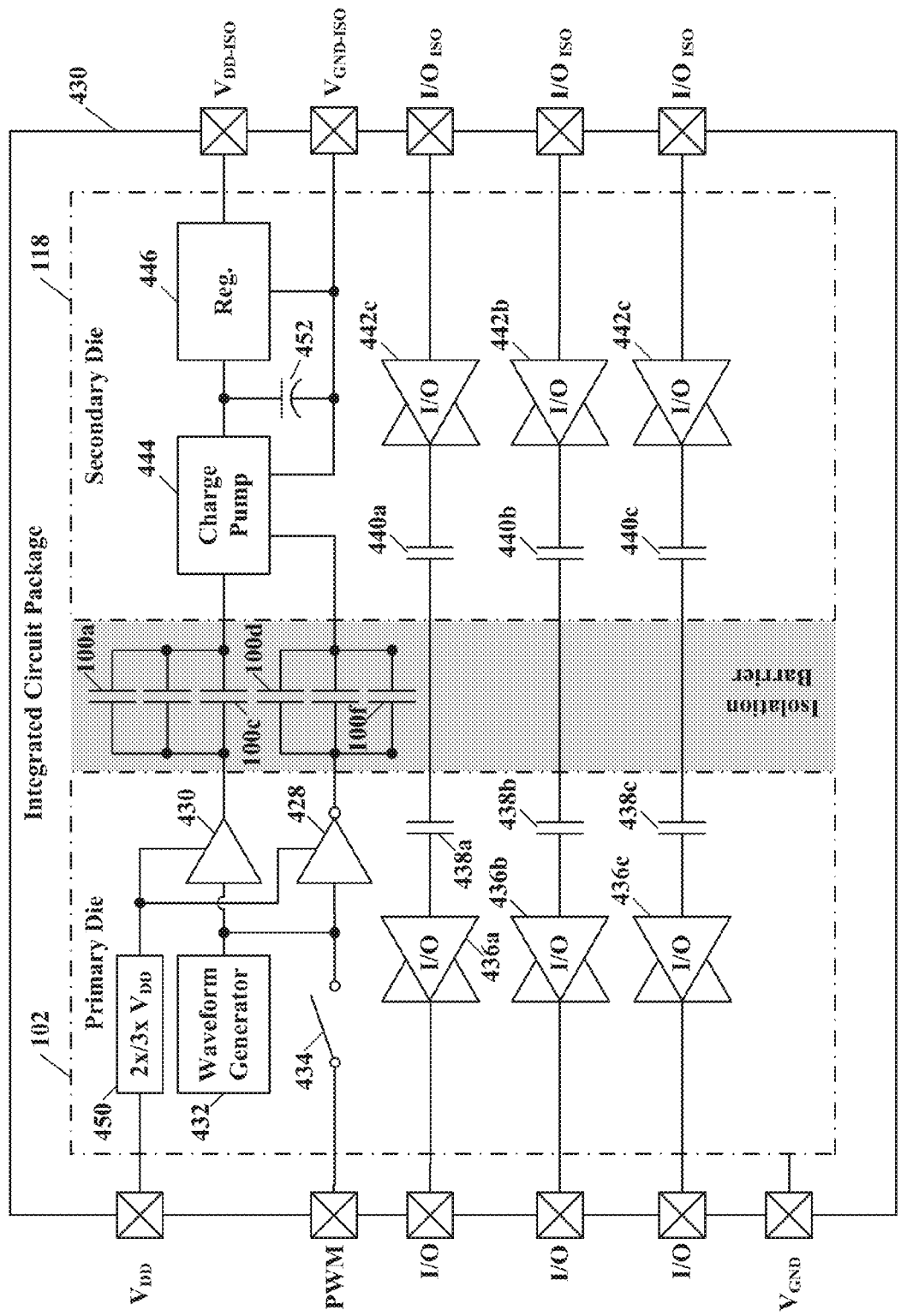
FIG. 4 illustrates a schematic block diagram of a plurality of high voltage rated isolation capacitors coupling power and signal circuits between a primary integrated circuit and a secondary integrated circuit, according to specific example embodiments of this disclosure.

Referring to FIG. 4, depicted is a schematic block diagram of a plurality of high voltage rated isolation capacitors coupling power and signal circuits between a primary integrated circuit and a secondary integrated circuit, according to specific example embodiments of this disclosure. Power may be isolated and transferred from the first voltage domain to the second voltage domain, or visa-versa, using an alternating current (AC) voltage through a plurality of high voltage rated isolation capacitors 100, e.g., isolation capacitors 100a-100f. This AC voltage may be generated by a waveform generator 432, e.g., oscillator, power switches controlled by pulse width modulation (PWM) modulator, etc., or an external pulse width modulation (PWM) signal when a switch 434 is closed and the waveform generator 432 is inactive. Drivers 430 and 428 may provide a push-pull (e.g., differential signal) waveform not requiring a ground reference through the isolation capacitors 100a-100f to a voltage charge pump 444 that may then provide an isolated voltage to a voltage regulator 446 in the second voltage domain. Programmable input/output (I/O) 436 in the first voltage domain and programmable input/output (I/O) 442 in the second voltage domain may be provided and DC isolated with smaller series connected capacitors 438 and 440 (increased voltage withstand) or by additional isolation capacitors 100.

Figure 6:
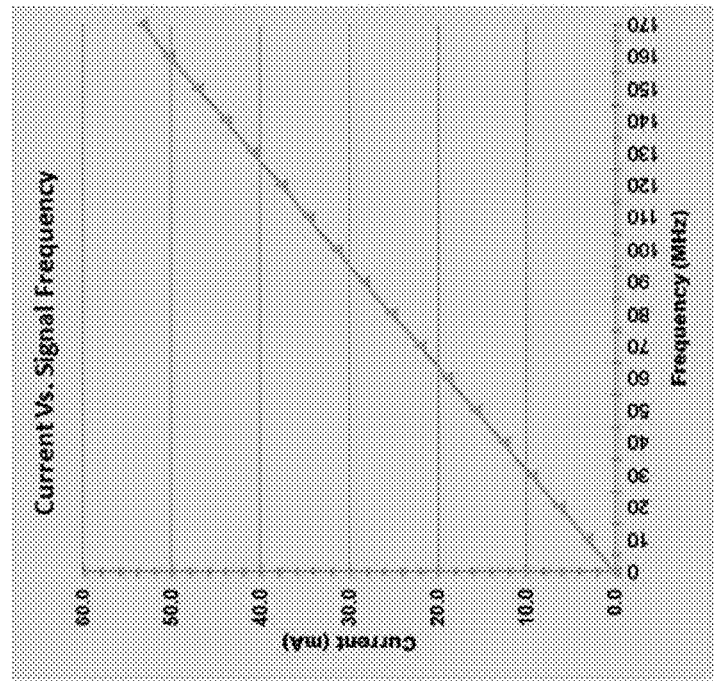
FIG. 6 illustrates a table and a graph of the current carrying capabilities of a 10 picofarad (pF) capacitor versus signal frequency applied thereto, according to the teachings of this disclosure.

Referring to FIG. 6, depicted are a table and a graph of the current carrying capabilities of a 10 picofarad (pF) capacitor versus signal frequency applied thereto, according to the teachings of this disclosure. The isolation capacitors 100 may preferably have a capacitance value of about 10 picofarads. The table and graph shown in FIG. 6 provide current carrying capabilities at different frequencies for a 10 pF capacitor. When one 10 pF capacitor cannot supply a sufficient amount of current at a desired frequency then adding additional parallel connected isolation capacitors 100 may be appropriate, e.g., see FIG. 4, isolation capacitors 100a-100f.

In lieu of or in addition to paralleling isolation capacitors 100, a higher AC voltage amplitude may be generated from the primary 102 by using a voltage doubler/tripler 450. This higher AC voltage may be coupled to the drivers 430 and 428 to produce a drive power signal having a higher amplitude that will be isolation coupled to the charge pump 444 through the isolation capacitors 100. However, for peak power demand situations that may exceed the current capabilities of the isolation capacitors 100 (see FIG. 6), a higher capacitance value capacitor 452 having lower withstand and operating voltages may be added to the secondary IC 118, either on the integrated circuit or external to the IC package 430 (not shown). The higher capacitance, lower operating voltage capacitor 452 may be sized to provide peak current demand from the regulator 446, while the voltage through the isolation capacitors 100 recharges the capacitor 452 when current demand from the regulator 446 is running less than peak demand.

Referring back to FIG. 4, low level signals from signal output drivers to signal input drivers may have much lower signal current requirements, e.g., higher impedances. Therefore, small value capacitors may be effectively used, e.g., about one (1) pF. Capacitors 440 may be of the same construction as the isolation capacitors 100, or constructions know in the integrated circuit fabrication arts. Any capacitor blocks DC so preferably signal data transfers between circuits in the first and second voltage domains will be edge triggered with latches or registers for long term data logic level retention. These isolation capacitors 100 may also be used for power supply applications in microcontrollers and other analog products and are not limited only to isolation devices.

Figure 5:
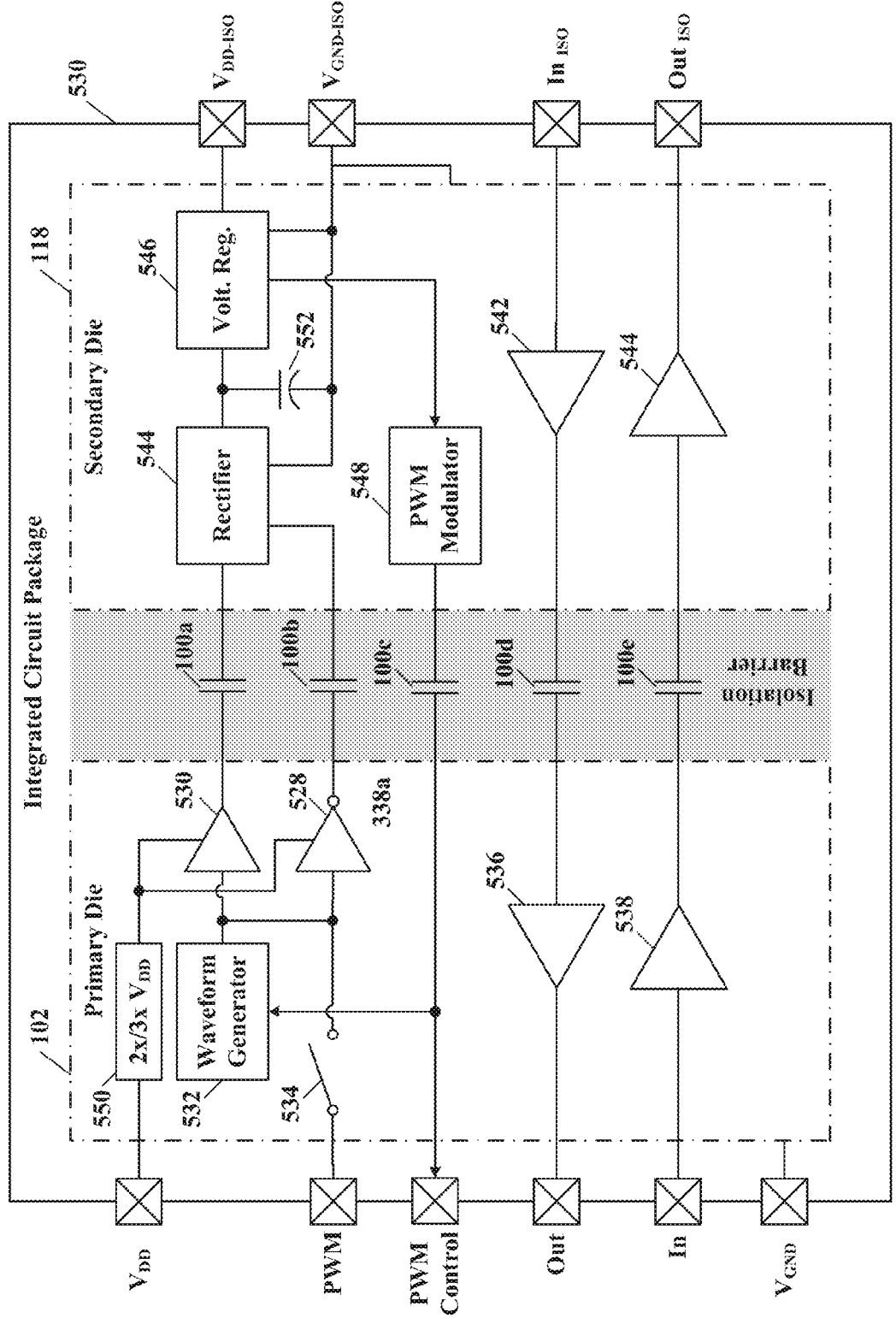
FIG. 5 illustrates a schematic block diagram of a plurality of high voltage rated isolation capacitors coupling power and signal circuits between a primary integrated circuit and a secondary integrated circuit wherein the circuits of the secondary integrated circuit control power transfer from the primary integrated circuit to the secondary integrated circuit, according to another specific example embodiment of this disclosure.

Referring to FIG. 5, depicted is a schematic block diagram of a plurality of high voltage rated isolation capacitors coupling power and signal circuits between a primary integrated circuit and a secondary integrated circuit wherein the circuits of the secondary integrated circuit control power transfer from the primary integrated circuit to the secondary integrated circuit, according to another specific example embodiment of this disclosure. Power may be isolated and transferred from the first voltage domain to the second voltage domain, or visa-versa, using an alternating current (AC) voltage through high voltage rated isolation capacitors 100a and 100b. This AC voltage may be generated by a waveform generator 532, e.g., oscillator, power switches controlled by pulse width modulation (PWM) modulator, etc., or an external pulse width modulation (PWM) signal when a switch 534 is closed and the waveform generator 532 is inactive. Drivers 530 and 528 may provide a push-pull (e.g., differential signal) waveform not requiring a ground reference through the isolation capacitors 100a and 100b to a rectifier 544.

The rectifier 544 provides a DC voltage to a voltage regulator 546 that provides a power source voltage in the second voltage domain. The voltage regulator 546 may also provide an error voltage between an internal voltage reference (not shown) and the isolated voltage $V_{DD-ISO}$ to a PWM modulator 548. The output of the PWM modulator 548 provides a feedback control signal through isolation capacitor 100c to the waveform generator 532 or an external PWM generator (not shown). From this feedback control signal the waveform generator 532 may vary its output amplitude and/or frequency to maintain a desired isolated voltage on the capacitor 552. Isolated inputs from the first voltage domain may be received, for example, by an input circuit 538 and isolation coupled through the isolation capacitor 100e to an output driver circuit 544 to the second voltage domain. Similarly, isolated inputs from the second voltage domain may be received, for example, by an input circuit 542 and isolation coupled through the isolation capacitor 100d to an output driver circuit 536 to the first voltage domain.

A higher AC voltage amplitude may be generated from the primary IC 102 by using a voltage doubler/tripler 550. This higher AC voltage may be coupled to the drivers 530 and 528 to produce a drive power signal having a higher amplitude that will be isolation coupled to the rectifier 544 through the isolation capacitors 100. However, for peak power demand situations that may exceed the current capabilities of the isolation capacitors 100 (see FIG. 6), a higher capacitance value capacitor 552 having lower withstand and operating voltages may be added to the secondary 118, either on the integrated circuit or external to the IC package 530 (not shown). The higher capacitance, lower operating voltage capacitor 552 may be sized to provide peak current demand from the regulator 546, while the current and voltage through the isolation capacitors 100 recharges the capacitor 552 when current demand from the regulator 546 is not so large. For further efficiency the voltage regulator 546 may provide two stage voltage control wherein when the capacitor 552 is charging to a higher voltage, a PWM modulator 548 may lower the frequency and/or amplitude of the waveform generator 532 to prevent the capacitor 552 from being overvoltage charged. Likewise, when the capacitor 552 charge voltage becomes lower, the PWM modulator 548 may increase the frequency and/or amplitude of the waveform generator 532. Tighter voltage control after the capacitor 552 may be performed in the voltage regulator in a standard manor, e.g., switch mode power supply (SMPS).

It should be noted that the supply voltage ($V_{DD}$) in the first voltage domain is transferred as AC energy using an internal waveform generator 532, and transferred to the second voltage domain side across the isolation barrier through the isolation capacitors 100a and 100b. The DC supply voltage ($V_{DD-ISO}$) may be developed from the rectified AC signal from the isolation capacitors 100a and 100b, and regulated through a feedback circuit that is formed by the PWM modulator 548 and feedback isolation coupling capacitor 100c.

Figure 7:
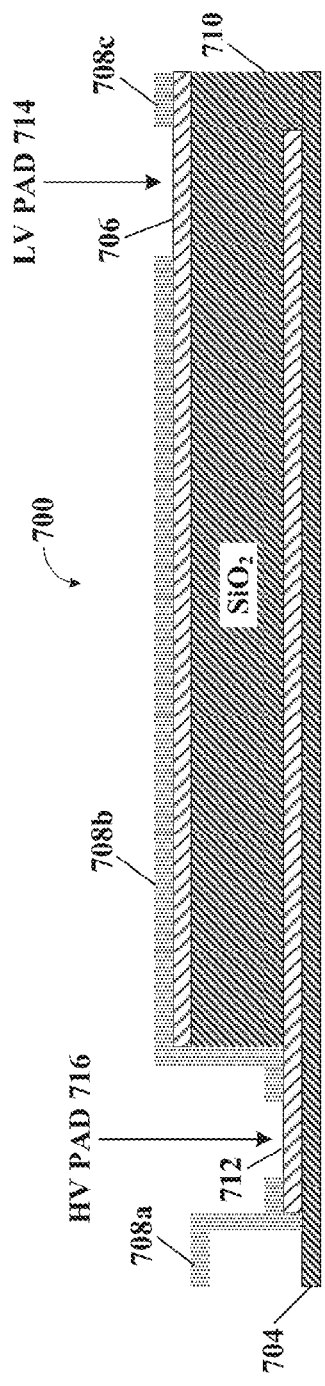
FIGS. 7 and 7A illustrate schematic elevational view diagrams of a plurality of inverse stacked high voltage rated isolation capacitors formed on an integrated circuit, according to another specific example embodiment of this disclosure.
Figure 7A:
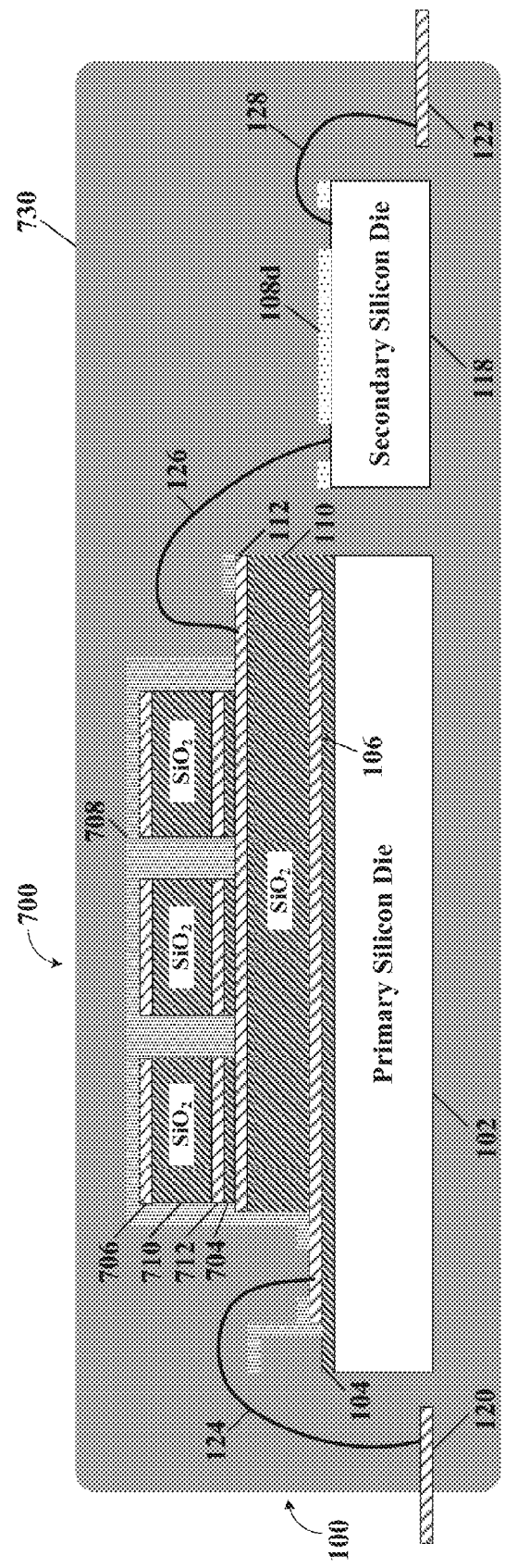

Referring to FIGS. 7 and 7A, depicted are schematic elevational view diagrams of a plurality of inverse stacked high voltage rated isolation capacitors formed on an integrated circuit, according to another specific example embodiment of this disclosure. Another high voltage rated isolation capacitor, generally represented by the numeral 700, may comprise an insulating layer 704 over the second electrically conductive layer 112, a third conductive layer 712 over the insulating layer 704, an insulating dielectric layer 710 over a portion of the third conductive layer 712, a fourth conductive layer 706 over the insulating dielectric layer 710, and an insulating layer 708 over the fourth conductive layer 706 and a portion of the third conductive layer 712. A third pad opening 716 in the insulating layer 708 may provide electrical connection access to the third conductive layer 712. A fourth pad opening 714 in the insulating layer 708 may provide electrical connection access to the fourth conductive layer 706, The high voltage rated isolation capacitor(s) 700 may be positioned over and attached to the high voltage rated isolation capacitor(s) 100 deposed on the integrated circuit 102. Construction of the high voltage rated isolation capacitor(s) 700 may be substantially the same as the high voltage rated isolation capacitor(s) 100 except that the third and fourth conductive layers 712 and 706, respectively, may be inverted so that a less thick electrical insulation (e.g., electrical insulating layer 704) has to be placed between the isolation capacitors 100 and 700 in order to maintain a desired voltage break down rating between the first and second voltage domains. The primary and secondary ICs 102 and 118, and the isolation capacitors 100 and 700 may be encapsulated (packaged) in an integrated circuit package 730.

Figure 8:
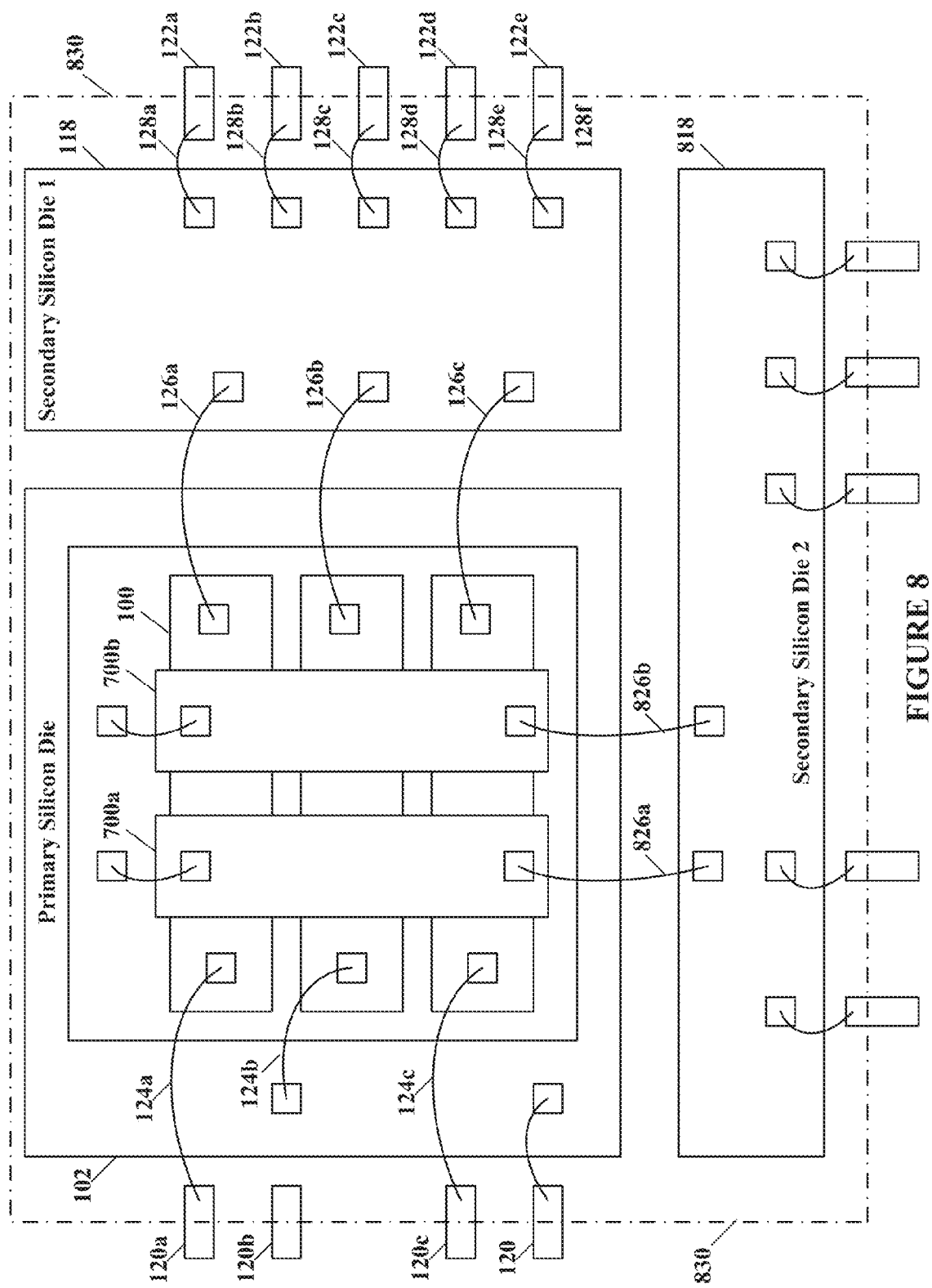
FIG. 8 illustrates a schematic plan view diagram of a plurality of high voltage rated isolation capacitors formed on a primary integrated circuit and coupled to first and second secondary integrated circuits, according to another specific example embodiment of this disclosure.

Referring to FIG. 8, depicted is a schematic plan view diagram of a plurality of high voltage rated isolation capacitors formed on a primary integrated circuit and coupled to first and second secondary integrated circuits, according to another specific example embodiment of this disclosure. The isolation capacitors 100 and 700 may be placed perpendicular to each other and another secondary IC 818 may be coupled to the isolation capacitors 700. This allows two or more secondary ICs to be packaged, e.g., IC package 830, with the primary IC 102. The secondary ICs 118 and 818 may both be in a second voltage domain, or the secondary IC 118 may be in the second voltage domain and the secondary IC 818 may be in the third voltage domain, wherein both secondary ICs 118 and 818 may be completely isolated from the primary IC 102 in the first voltage domain. In addition, the secondary ICs 118 and 818 may be isolated from each other when configured in second and third voltage domains. The primary IC 102 may comprise a microcontroller, etc., and the secondary IC 118/818 may be digital signal processors (DSP), charge time measurement units (CTMU), co-processors, specialized input output interfaces, counters, timers, analog-to-digital converters (ADC), digital-to-analog converters (DAC), etc. The primary and secondary ICs 102, 118 and 818, and the isolation capacitors 100 and 700 may be encapsulated (packaged) in an integrated circuit package 830.

A plurality of high voltage rated isolation capacitors 100 and 700 may be connected as necessary for a particular application. Each of the high voltage rated isolation capacitors 100 and 700 may be formed as shown in FIGS. 7 and 7A and described hereinabove. It is contemplated and with the scope of this disclosure that the high voltage rated isolation capacitors 100 and 700 may be formed in any geometric shape desired and they are not limited to square or rectangular shapes as shown in the specific example embodiment shown in FIGS. 3 and 8.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

What is claimed is:

1. An integrated circuit device adapted for high voltage isolation between different voltage domains, comprising:
   a primary integrated circuit coupled to a first voltage domain;
   a secondary integrated circuit coupled to a second voltage domain;
   a first insulating layer over at least a portion of a face of the primary integrated circuit;
   a plurality of high voltage rated isolation capacitors positioned over the first insulating layer, wherein each of the plurality of high voltage rated isolation capacitors comprises
      a first electrically conductive layer on the first insulating layer,
      a high voltage rated dielectric layer on a portion of a respective first electrically conductive layers, and
      a second electrically conductive layer on the respective high voltage rated dielectric layer;
   a waveform generator provided in the primary integrated circuit;
   push-pull drivers provided in the primary integrated circuit, having inputs coupled to the waveform generator and outputs coupled to respective ones of the first electrically conductive layers; and
   an alternating current (AC)-to-direct current (DC) converter provided in the secondary integrated circuit and having inputs coupled to respective ones of the second electrically conductive layers, whereby AC power is transferred from the push-pull drivers to the AC-to-DC converter.

2. The integrated circuit device according to claim 1, further comprising a second insulating layer over at least a portion of the second electrically conductive layers, over portions of the high voltage rated dielectric layers and the first electrically conductive layers, wherein the second insulating layer has
   first openings over the first electrically conductive layers for first bond wires to couple the first electrically conductive layers to circuit connection pads on the primary integrated circuit, and
   second openings over the second electrically conductive layers for second bond wires to couple the second electrically conductive layers to circuit connection pads on the secondary integrated circuit.

3. The integrated circuit device according to claim 1, wherein the first and second electrically conductive layers are metal.

4. The integrated circuit device according to claim 1, wherein the high voltage rated dielectric layers comprise silicon dioxide ($SiO_2$).

5. The integrated circuit device according to claim 1, wherein the high voltage rated dielectric layers each have a thickness of about four (4) microns ($\mu$).

6. The integrated circuit device according to claim 1, wherein the high voltage rated isolation capacitors each have a capacitance value of about 10 picofarads.

7. The integrated circuit device according to claim 1, wherein the primary integrated circuit is a microcontroller.

8. The integrated circuit device according to claim 1, wherein each of the outputs of the push-pull drivers is coupled to at least two of the first electrically conductive layers, and corresponding at least two second electrically conductive layers are coupled to the AC-to-DC converter.

9. The integrated circuit device according to claim 1, further comprising a low voltage capacitor coupled to an output of the AC-to-DC converter, wherein the low voltage capacitor has a capacitance value greater than a one of the plurality of high voltage rated isolation capacitors.

10. The integrated circuit device according to claim 1, further comprising a voltage regulator coupled to an output of the AC-to-DC converter.

11. The integrated circuit device according to claim 10, wherein the voltage regulator has a voltage feedback control output coupled to a one of the second electrically conductive layers of the plurality of high voltage rated isolation capacitors, and a respective one of the first electrically conductive layers of the plurality of high voltage rated isolation capacitors coupled to a control input of the waveform generator, wherein the voltage feedback control output of the voltage regulator controls an output of the waveform generator.

12. The integrated circuit device according to claim 11, wherein the waveform generator is an oscillator and the voltage regulator controls the output amplitude thereof.

13. The integrated circuit device according to claim 11, wherein the waveform generator is an oscillator and the voltage regulator controls the output frequency thereof.

14. The integrated circuit device according to claim 11, further comprising a PWM modulator coupled between the voltage feedback control output of the voltage regulator and the one of the second electrically conductive layers of the plurality of high voltage rated isolation capacitors, and the waveform generator comprises power switches controlled by the PWM modulator.

15. The integrated circuit device according to claim 1, wherein the waveform generator is an oscillator.

16. The integrated circuit device according to claim 1, further comprising a voltage multiplier coupled between a voltage source in the first voltage domain and supplying a multiplied operating voltage to the push-pull drivers.

17. The integrated circuit device according to claim 16, wherein the voltage multiplier multiplies the voltage source by two.

18. The integrated circuit device according to claim 16, wherein the voltage multiplier multiplies the voltage source by three.

19. The integrated circuit device according to claim 1, wherein the AC-to-DC converter is a charge pump.

20. The integrated circuit device according to claim 1, wherein the AC-to-DC converter is a rectifier.

* * * * *